United States Patent [19]

Tan et al.

[11] Patent Number: 5,620,828
[45] Date of Patent: Apr. 15, 1997

[54] POSITIVE PHOTORESIST COMPOSITION CONTAINING QUINONEDIAZIDE ESTERIFICATION PRODUCT, NOVOLAK RESIN AND POCYHYDROXY ALKALI DISSOLUTION ACCELERATOR

[75] Inventors: Shiro Tan; Yasumasa Kawabe, both of Shizuoka, Japan

[73] Assignee: Fuji Photo Film Co., Ltd., Kanagawa, Japan

[21] Appl. No.: 579,410

[22] Filed: Dec. 27, 1995

[30] Foreign Application Priority Data

Dec. 28, 1994 [JP] Japan ................................. 6-328119

[51] Int. Cl.$^6$ ...................................................... G03F 7/023
[52] U.S. Cl. ........................... 430/191; 430/192; 430/193
[58] Field of Search .................................... 430/191, 192, 430/193

[56] References Cited

U.S. PATENT DOCUMENTS

| | | | |
|---|---|---|---|
| 5,366,843 | 12/1994 | Jeffries, III | 430/165 |
| 5,460,917 | 10/1995 | Kobayashi et al. | 430/165 |
| 5,478,691 | 12/1995 | Miyashita et al. | 430/190 |
| 5,494,773 | 2/1996 | Tan et al. | 430/191 |

*Primary Examiner*—Christopher G. Young
*Attorney, Agent, or Firm*—Sughrue, Mion, Zinn, Macpeak & Seas

[57] ABSTRACT

A positive photoresist composition is disclosed, which comprises prescribed amounts of an alkali-soluble novolak resin which is obtained from prescribed amounts of m- and p-cresols and at least one xylenol selected from 2,3-, 3,4- and 3,5-xylenols and an aldehyde, a 1,2-quinonediazide compound which is an esterified product of a polyhydroxy compound having from 3 to 7 phenolic hydroxyl groups in the molecule with 1,2-naphthoquinonediazido-5(and/or 4)-sulfonyl chloride(s) and an alkali dissolution accelerator which is a polyhydroxy compound having a molecular weight of 1,000 or less and from 2 to 7 phenolic hydroxyl groups in the molecule.

3 Claims, No Drawings

POSITIVE PHOTORESIST COMPOSITION CONTAINING QUINONEDIAZIDE ESTERIFICATION PRODUCT, NOVOLAK RESIN AND POCYHYDROXY ALKALI DISSOLUTION ACCELERATOR

FIELD OF THE INVENTION

The present invention relates to a positive photoresist composition sensitive to radiation. More particularly, the present invention relates to a positive photoresist composition for forming fine patterns which has a high resolving power and sensitivity, and provides good sectional shapes.

The positive photoresist composition of the present invention is coated on a substrate such as a semiconductor water, glass, a ceramic or a metal in a thickness of from 0.5 to 3 μm by a spin coating method or a roller coating method. Subsequently, the coated layer is heated and dried, and a circuit pattern or other pattern is printed on the layer by, for example, irradiation with ultraviolet ray through an exposure mask, and then developed to form a positive image.

Further, a pattern may be formed on the substrate by etching using the positive image as a mask. Typical applications of the positive photoresist include manufacture of semiconductors such as IC and the like, manufacture of circuit boards for liquid crystals and thermal heads, and other photofabrication processes.

BACKGROUND OF THE INVENTION

As positive photoresist composition there are normally used compositions comprising an alkali-soluble resin and a naphthoquinonediazide compound as a photosensitive material. Example of such composition include novolak type phenol resins/naphthoquinonediazide-substituted compounds as disclosed in U.S. Pat. Nos. 3,666,473, 4,115,128 and 4,173,470. Most typical examples of such composition include novolak resin composed of cresol-formaldehyde/ trihydroxybenzophenone1,2-naphthoquinonediazidosulfonic ester as disclosed in L. F. Thompson, *Introduction to Microlithoqraphy*, ASC Publishing Co., No. 219, pages 112 to 121.

The novolak resin thus used as a binder not only is soluble in an aqueous alkali solution without being swelled by the solution, but also forms an image-bearing film which can be used as an etching mask having high resistance particularly to plasma etching. Consequently, novolak resins are especially useful in this application of use. On the other hand, the naphthoquinonediazide compound, which is used as a photosensitive material, is unique in that it itself functions as a dissolution inhibitor to reduce the alkali solubility of the novolak resin while it decomposes upon irradiation with light to yield an alkali-soluble substance thereby serving to enhance, rather than reduce, the alkali solubility of the novolak resin. Thus, due to this large change in its property upon light irradiation, naphthoquinonediazide compounds are useful especially as a photosensitive material in positive photoresists.

From the standpoints described above, a large number of positive photoresists comprising a novolak resin and a photosensitive naphthoquinonediazide compound have so far been developed and put to practical use, and such resist materials have succeeded in giving sufficient results in processing for forming patterns having line widths as small as the order of 1.5 to 2 μm.

However, the degree of integration in integrated circuits is becoming higher increasingly, and the production of substrates for semiconductor circuits, e.g., VLSI's (very large scale integrated circuit), has come to necessitate a processing for forming an ultrafine pattern having a line width of 1 μm or smaller. The photoresists for use in this application are required to have a high sensitivity in view of a high resolving power, a high pattern reproducing accuracy to reproduce the image of an exposure mask and a high productivity. However, conventional photoresists described above could not meet these problems.

As techniques for improving the above problems, there are known photoresist compositions comprising a naphthoquinonediazide photosensitive material and an alkali-soluble resin comprising specific monomers, or an alkali-soluble resin comprising specific monomers and a low-molecular weight alkali dissolution accelerator. Examples thereof are shown below.

JP-B-2-51499 (the term "JP-B" as used herein refers to an "examined Japanese patent publication") discloses resins obtained by condensing from 30 to 90 molar ratio of m-cresol, from 5 to 40 molar ratio of p-cresol, and xylenol (exclusive of 2,5-xylenol) using an aldehyde as an alkali-soluble novolak resin.

However, the techniques disclosed in JP-B-2-51499 are not sufficient in the sensitivity, the resolving power and the defocus latitude.

JP-B-3-36420 discloses resins obtained from condensation monomers containing m-cresol and xylenol but not containing p-cresol and an aldehyde as an alkali-soluble novolak resin.

However, the techniques disclosed in JP-B-3-36420 are not sufficient in the defocus latitude.

JP-B-6-54386 discloses resins obtained by condensing from 30 to 90 mol % of m-cresol and phenols containing from 70 to 10 mol % of the compound represented by the following formula (I) (there is no disclosure about p-cresol):

$$(OH)_n-Ph-X_m \qquad (I)$$

wherein X represents —CH$_3$, —C$_2$H$_5$, —C(CH$_3$)$_3$, —CO$_2$CH$_3$ or —CO$_2$C$_2$H$_5$; n is from 1 to 3; m is from 1 to 3; and Ph represents a phenyl group with aldehydes as an alkali-soluble novolak resin.

However, the techniques disclosed in JP-B-6-54386 are not sufficient in the defocus latitude.

JP-B-3-54565 discloses resins obtained by condensing from 20 to 80 mol % of m-cresol, from 0 to 50 mol % of p-cresol, and phenols containing from 20 to 80 mol % of at least one compound represented by formula (I) other than m-cresol and p-cresol with aldehydes. However, the techniques disclosed in JP-B-3-54565 are not sufficient in the defocus latitude. Further, JP-B-3-54565 discloses inclusion of 2H-pyrido[3,2-b]-1,4-oxazin-3(4H)-ones to increase sensitivity, but there arises another problem of generation of scum.

JP-A-6-202321 discloses resist compositions comprising a novolak resin obtained by condensing a phenol mixture containing m-cresol, p-cresol, and 2,5-xylenol with an aldehyde, and an alkali-soluble compound having a molecular weight of less than 900. However, the techniques disclosed in JP-A-6-202321 are not sufficient in the sensitivity, the resolving power and the defocus latitude.

JP-A-4-122938 discloses photoresist compositions comprising an alkali-soluble phenol-novolak resin having the ratio of the weight average molecular weight to the number average molecular weight of from 1.5 to 4.0, and from 2 to 30 wt %, based on the novolak resin, of a low- molecular weight compound having from 2 to 8 phenolic hydroxyl groups per molecule. However, there are no suggestions about the specific monomers of the alkali-soluble phenol-novolak resins and the constitutional ratios thereof.

These techniques are also not sufficient and the defocus latitude is narrow, therefore, resist compositions of superior resist performances are still desired.

SUMMARY OF THE INVENTION

Accordingly, the objects of the present invention are to provide (i) a positive photoresist composition having a high resolving power, (ii) a positive photoresist composition having a high sensitivity, and (iii) a positive photoresist composition having a broad defocus latitude, all of which are practically useful in manufacture of semiconductor devices.

The present inventors have extensively investigated the above described problems of the prior art compositions and, as a result, have found that the objects of the present invention can be attained by a positive photoresist composition comprising prescribed amounts of a specific alkali-soluble novolak resin, a specific quinonediazide compound and a specific alkali dissolution accelerator. Thus, the present invention has been accomplished.

Namely, these and other objects of the present invention have been achieved by a positive photoresist composition comprising an alkali-soluble novolak resin (A), a 1,2-quinonediazide compound (B), and an alkali dissolution accelerator (C), wherein the alkali-soluble novolak resin (A) is a novolak resin which is obtained by condensing the following monomers (1) to (3):

(1) from 40 to 90 mol % of m-cresol, (2) from 2 to 4 mol % of p-cresol, and (3) from 10 to 60 mol % of at least one xylenol selected from 2,3-xylenol, 3,4-xylenol and 3,5-xylenol with an aldehyde, and which has a weight average molecular weight of from 3,000 to 20,000, a degree of dispersion (Mw/Mn) of from 1.5 to 4.0, and an alkali dissolution speed in a 2.38% aqueous solution of tetramethylammonium hydroxide at 23° C. of from 3 to 100 Å/sec, the 1,2-quinonediazide compound (B) is an esterified product of a polyhydroxy compound having from 3 to 7 phenolic hydroxyl groups in the molecule and 1,2-naphthoquinonediazido-5-sulfonyl chloride and/or 1,2-naphthoquinonediazido-4-sulfonyl chloride, the alkali dissolution accelerator (C) is a polyhydroxy compound having a molecular weight of 1,000 or less and having from 2 to 7 phenolic hydroxyl groups in the molecule, and the 1,2-quinonediazide compound (B) is present in an amount of from 35 to 100 parts by weight, and the alkali dissolution accelerator (C) is present in an amount of from 10 to 60 parts by weight, respectively, per 100 parts by weight of said alkali-soluble novolak resin (A).

It has become possible for the first time to improve all of the resolving power, the sensitivity and the defocus latitude together by the combination of the above constitutions by the present invention.

DETAILED DESCRIPTION OF THE INVENTION

Alkali-soluble novolak resin (A) for use in the present invention is further described in detail below. Alkali-soluble novolak resin (A) may be obtained by condensation of monomers comprising (1) m-cresol, (2) p-cresol, and (3) xylenol (at least one of 2,3-xylenol, 3,4-xylenol and 3,5-xylenol) with aldehydes.

(1) m-cresol, (2) p-cresol, and (3) xylenol (at least one of 2,3-xylenol, 3,4-xylenol and 3,5-xylenol) may be used in the form of a methylol compound by adding formalin thereto in advance.

In the present invention, the mixing ratio of (1) m-cresol, (2) p-cresol, and (3) xylenol (at least one of 2,3-xylenol, 3,4-xylenol and 3,5-xylenol) is preferably as follows since it provides excellent sensitivity, resolving power and defocus latitude.

That is, the mixing ratio in the present invention is preferably:

(1) m-cresol: from 40 mol % to 90 mol %

(2) p-cresol: from 2 mol % to 4 mol %

(3) xylenol: from 10 mol % to 60 mol %;

more preferably:

(1) m-cresol: from 55 mol % to 85 mol %

(2) p-cresol: from 2 mol % to 4 mol %

(3) xylenol: from 15 mol % to 45 mol %; and still more preferably:

(1) m-cresol: 60 mol % or more and less than 80 mol %

(2) p-cresol: 2 mol % or more and less than 4 mol %

(3) xylenol: 20 mol % or more and less than 40 mol %.

The mol % as used herein is based on the total moles of the monomer (1) to (3).

Examples of the aldehyde to be used in the present invention include formaldehyde, paraformaldehyde, trioxane, acetaldehyde, furfural, benzaldehyde, hydroxybenzaldehydes, crotonaldehyde, and chloroacetaldehyde. Preferred of them are formaldehyde and paraformaldehyde.

These aldehydes are used either alone or in combination of two or more.

The amount of the aldehyde to be used is from 0.4 to 2.0 mol %, preferably from 0.5 to 1.5 mol %, and more preferably from 0.6 to 1.2 mol %, based on the total moles of the monomers (1) to (3). When the amount of the aldehyde used is within this range, a novolak resin well-balanced in the sensitivity, the resolving power and the defocus latitude can be obtained.

Examples of an acidic catalyst for use in the condensation reaction include hydrochloric acid, sulfuric acid, formic acid, acetic acid, and oxalic acid, of which oxalic acid being preferred.

The weight average molecular weight of the novolak resin of the present invention comprising the above components is preferably from 3,000 to 20,000, more preferably from 4,000 to 18,000, and still preferably from 5,000 to 16,000. When the molecular weight is less than 3,000, the film in the unexposed area after development considerably decreases, whereas when it exceeds 20,000, the developing speed is reduced and the sensitivity is lowered. The effects of the present invention are exhibited most effectively when low molecular components are removed from the novolak resin and the molecular weight after the removal is within the above range. The removal of low molecular components from the novolak resin by fractional precipitation, fractional dissolution, column chromatography and the like as disclosed, for example, in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147 and JP-A-4-122938 is preferred since performances such as less generation of scum and heat resistance are improved. The amount of the low molecular components to be removed is preferably from 20 to 70% by weight, more preferably from 30 to 60% by weight.

The terminology "weight average molecular weight" used herein means the value measured by gel permeation chromatography (GPC) in terms of polystyrene.

In addition, the degree of dispersion of the novolak resin (the ratio of the weight average molecular weight to the number average molecular weight, that is Mw/Mn) is from 1.5 to 4.0, preferably from 1.8 to 3.5, more preferably from 2.0 to 3.3. If this value exceeds 4, the performances such as the sensitivity, the heat resistance and good profile cannot be obtained. On the other hand, if it is less than 1.5, a highly accurate purification process come to be necessary for the synthesis of novolak resins, thus it is impracticable.

The alkali dissolution speed of a novolak film composed of the alkali-soluble novolak resin in a 2.38% aqueous solution of tetramethylammonium hydroxide at 23° C. is from 3 to 100 Å/sec, preferably from 5 to 95 Å/sec, and more preferably from 10 to 90 Å/sec. When the alkali dissolution speed is within this range, an appropriate sensitivity, a high resolving power and a broad defocus latitude can be obtained.

In the present invention, the alkali dissolution speed of the novolak resin means the dissolution speed (Å/sec) obtained from the relation between the time (sec) required for the coated film to be completely dissolved and the film thickness (Å) when the novolak resin coated film is immersed in a 2.38% aqueous solution of tetramethylammonium hydroxide.

Examples of alkali-soluble resins which can be used in combination with the foregoin novolak resin are not particularly limited so long as they are compatible with the novolak resin, but polyhydroxystyrene, acetone-pyrogallol resin, acetone-resorcinol resin are preferred because they do not deteriorate the heat resistance.

1,2-Quinonediazide compound (B) to be used in the present invention is described below in further detail.

1,2-Quinonediazide compound (B) is an esterified product of a polyhydroxy compound having from 3 to 7 phenolic hydroxyl groups in the molecule and 1,2-naphthoquinonediazido-5-sulfonyl chloride and/or 1,2-naphthoquinonediazido-4-sulfonyl chloride. This esterified product, 1,2-quinonediazide compound (B), is used as a photosensitive material (photosensitive compound).

1,2-Quinonediazide compound (B) to be used in the present invention can be obtained by the esterification reaction of the polyhydroxy compound shown below and 1,2-naphthoquinonediazido-5-(and/or -4-)sulfonyl chloride in the presence of a basic catalyst.

The polyhydroxy compound to be used in the present invention preferably have from 3 to 6, more preferably from 3 to 5, phenolic hydroxyl groups in the molecule. When the number of phenolic hydroxyl groups in the molecule of the polyhydroxy compound is within this range, an appropriate sensitivity can be obtained and a resolving power and a defocus latitude are excellent.

Examples of the polyhydroxy compound to be used in the present invention include:

bis((poly)hydroxyphenyl)alkanes such as bis(2,3,4-trihydroxyphenyl)methane, bis(2,4-dihydroxyphenyl)propane-1, bis(2,3,4-trihydroxyphenyl)propane-1, and nordihydroguaiaretic acid;

polyhydroxybenzoates such as propyl 3,4,5-trihydroxybenzoate, phenyl 2,3,4-trihydroxybenzoate, and phenyl 3,4,5-trihydroxybenzoate;

bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl) methane, bis(2,3,4-trihydroxybenzoyl)benzene, and bis(2,4,6-trihydroxybenzoyl)benzene;

alkylene-di(polyhydroxybenzoate)s such as ethylene glycol-di(3,5-dihydroxybenzoate) and ethylene glycoldi(3,4,5-trihydroxybenzoate);

polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

bis(polyhydroxy)sulfides such as 4,4'-thiobis(1,3-dihydroxy)benzene;

bis(polyhydroxyphenyl) ethers such as 2,2',4,4'-tetrahydroxydiphenyl ether;

bis(polyhydroxyphenyl) sulfoxides such as 2,2',4,4'-tetrahydroxydiphenyl sulfoxide;

bis(polyhydroxyphenyl) sulfones such as 2,2',4,4'-diphenyl sulfone;

polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5',-tetramethyltriphenylmethane, 4-[bis(3,5-dimethyl-4-hydroxyphenyl)-methyl]-2-methoxyphenol, 4,4'-(3,4-diol-benzylidene)bis(2,6-dimethylphenol), 4,4'-[(2-hydroxyphenyl)methylene]bis(2-cyclohexyl-5-methylphenol), 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, and 2,4,6,2',4',6'-hexahydroxy-5,5'-dipropionyltriphenylmethane;

polyhydroxytriphenylethanes such as 4,4',4"-ethylidenetrisphenol;

polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7',-hexol, 3,3,3',3'-tetramethyl-1,1'-spirobiindane-4,5,6,4',5',6',-hexol, and 3,3,3',3'-tetramethyl-1,1'-spirobiindane-4,5,6,5',6',7'-hexol;

polyhydroxyflavans such as 2,4,4-trimethyl-2',4',7,-trihydroxyflavan;

polyhydroxyphthalides such as 3,3-bis(3,4-dihydroxyphenyl)phthalide, 3,3-bis(2,3,4-trihydroxyphenyl)phthalide, and 3',4',5',6'-tetrahydroxy-spiro[phthalide-3,9',-xanthene];

flavonoid dyes such as morin, quercetin and rutin;

the polyhydroxy compounds disclosed in JP-A-4-253058 such as α,α',α"-tris(4-hydroxyphenyl)-1,3,5-triisopropylbenzene, α,α',α"-tris(3,5-dimethyl-4-hydroxyphenyl)-1,3,5triisopropylbenzene, α,α',α"-tris(3,5-diethyl-4-hydroxyphenyl)-1,3,5-triisopropylbenzene, α,α',α", -tris(3,5-di-n-propyl-4-hydroxyphenyl)-1,3,5-triisopropylbenzene, , α,α',α"-tris(3,5-diisopropyl-4-hydroxyphenyl)-1,3,5-triisopropylbenzene, α,α',α"-tris(3,5-di-n-butyl-4-hydroxyphenyl)-1,3,5-triisopropylbenzene, α,α',α"-tris(3-methyl-4-hydroxyphenyl)1,3,5-triisopropylbenzene, α,α',α"-tris(3-methoxy-4-hydroxyphenyl)1,3,5-triisopropylbenzene, α,α',α"-tris(2,4-dihydroxyphenyl)-1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α', α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene, and 1-[α-methyl-α-(2',4'-dihydroxyphenyl)ethyl]-3-[α', α'-bis(4"-hydroxyphenyl)ethyl]benzene;

the polyhydroxy compounds disclosed in JP-A-5-224410 such as α,α,α',α',α",α"-hexakis(4-hydroxyphenyl)-1,3,5-triethylbenzene, and the poly(hydroxyphenyl)alkanes disclosed in JP-A-5-303200 and EP 530148 such as 1,2,2,3-tetra(p-hydroxyphenyl)propane and 1,3,3,5-tetra(p-hydroxyphenyl)-pentane;

p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α, α',bis(2,3,4-trihydroxybenzoyl)-p-xylene, and α,α',α'-tris(2,3,4-trihydroxybenzoyl)mesitylene; and 2,6-bis(2-hydroxy-3,5-dimethylbenzyl)-p-cresol, 2,6bis(2-hydroxy-5'-methylbenzyl)-p-cresol, 2,6-bis(2,4,6-trihydroxybenzyl)-p-cresol, 2,6-bis(2,3,4-trihydroxybenzyl)p-cresol, 2,6-bis(2,3,4-trihydroxybenzyl)-3,5-dimethylphenol, 4,6-bis(4-hydroxy-3,5-dimethylbenzyl)pyrogallol, 2,6-bis(4-hydroxy-3,5-dimethylbenzyl)-1,3,4-trihydroxyphenol, 4,6-bis(2,4,6-trihydroxybenzyl)-2,4-dimethylphenol, 4,6-bis(2,3,4-trihydroxybenzyl)-2,5-dimethylphenol, 2,6-bis(4-hydroxybenzyl)-p-cresol, 2,6-bis(4-hydroxybenzyl)-4-cyclohexylphenol, 2,6-bis(4-hydroxy-3-methylbenzyl)-p-cresol, 2,6-bis(4-hydroxy-3,5-dimethylbenzyl)-p-cresol, 2,6-bis(4-hydroxy-2,5-dimethylbenzyl)-p-cresol, 2,6-bis(4-hydroxy-3-methylbenzyl)-4-phenylphenol, 2,2',6,6'-tetrakis[(4-hydroxyphenyl)methyl]-4,4'-methylenediphenol, 2,2',6,6'-tetrakis[(4-hydroxy-3-dimethylphenyl)methyl]-4,4'-methylenediphenol, 2,2',6,6'-tetrakis[(4-hydroxy-3-methylphenyl)methyl]-4,4'-methylenediphenol, and 2,2'-bis[(4-hydroxy-3,5-dimethylphenyl)methyl]-6,6'-dimethyl-4,4'-methylenediphenol.

Further, a low molecular weight phenolic resin such as a novolak resin can also be used.

The above described photosensitive material may be obtained by the esterification reaction, that is, predetermined amounts of a polyhydroxy compound and 1,2-naphthoquinonediazido-5-(and/or -4-)sulfonyl chloride are dissolved in a solvent such as dioxane, acetone, tetrahydrofuran, methyl ethyl ketone, N-methylpyrrolidone, chloroform, trichloroethane, trichloroethylene, or dichloroethane, and condensation reaction is carried out by adding dropwise thereto a basic catalyst such as sodium hydroxide, sodium carbonate, sodium hydrogencarbonate, triethylamine, 4-methylmorpholine, N-methylpiperazine, or 4-dimethylaminopyridine. The thus-obtained product is washed with water, then purified and dried.

In an ordinary esterification reaction, mixtures of compounds variously different in the esterification number and the esterification position are obtained, but only a specific compound can be selectively esterified by selecting the reaction condition or the structure of the polyhydroxy compound. The esterification ratio as used in the present invention means the average value of the mixture.

The esterification ratio thus defined can be controlled by the mixing ratio of the polyhydroxy compound and 1,2-naphthoquinonediazido-5-(and/or -4-)sulfonyl chloride as the raw materals. That is, since substantially all 1,2-naphthoquinonediazido-5-(and/or -4-)sulfonyl chloride added are subjected to esterification reaction, the mixture of the desired esterification ratio can be obtained by adjusting the mol ratio of the raw materials.

1,2-Naphthoquinonediazido-5-sulfonyl chloride and 1,2-naphthoquinonediazido-4-sulfonyl chloride can be used in combination in the present invention according to need.

The reaction temperature in the above described method is usually from −20°to 60° C. and preferably from 0°to 40° C.

The photosensitive material synthesized in the method as described above is used by blending with the alkali-soluble novolak resin to form a resin composition. The photosensitive material may be used either alone or as a mixture of two or more of them. The blending amount of the photosensitive material is from 35 to 100 parts by weight, preferably from 40 to 90 parts by weight, per 100 parts by weight of the alkali-soluble novolak resin. If the proportion of the photosensitive material is smaller than 35 parts by weight, the resist film remaining ratio after development is considerably reduced. If the proportion thereof exceeds 100 parts by weight, the sensitivity and solubility in solvents are reduced.

The alkali dissolution accelerator (C) to be used in the present invention is described below in further detail.

It is essential for the composition of the present invention to contain a polyhydroxy compound as an alkali dissolution accelerator for accelerating dissolution in a developing solution to attain the effects of the present invention.

The alkali dissolution accelerator (C) to be used in the present invention is a polyhydroxy compound having a molecular weight of 1,000 or less, preferably from 150 to 900, and more preferably from 250 to 600, and having from 2 to 7, preferably from 2 to 6, and more preferably from 2 to 5, phenolic hydroxyl groups in the molecule.

When the molecular weight and the number of the hydroxyl groups of the polyhydroxy compound are within the above ranges, an excellent sensitivity, resolving power and defocus latitude can be obtained.

Preferred examples of the polyhydroxy compound useful as alkali dissolution accelerator (C) include resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4,4'-biphenyltetrol, 4,4'-thiobis(1,3dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,1,2,2-tetrakis(4-hydroxyphenyl)ethane, 1,1,3-tris(hydroxyphenyl)butane, and p-[α, α,α',α'-tetrakis(4-hydroxyphenyl)]xylene.

The amount of these polyhydroxy compounds is usually from 10 to 60 parts by weight, preferably from 20 to 50 parts by weight, based on 100 parts by weight of the alkali-soluble resin. When the addition amount is within this range, an excellent sensitivity, resolving power and defocus latitude can be obtained.

Examples of a solvent to which the photosensitive material, the alkali-soluble novolak resin and the alkali dissolution accelerators according the present invention is dissolved include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, and propylene glycol monomethyl ether propionate. These organic solvents are used either alone or in combination of two or more.

Further, a high boiling point solvent such as N-methylformamide, N,N-dimethylformamide, N-methylacetamide, N,N-dimethylacetamide, N-methylpyrrolidone, dimethyl sulfoxide, and benzyl ethyl ether can be used in combination.

The positive photoresist composition of the present invention can contain a surfactant for further improving the coating property such as striation.

Examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine surfactants such as Eftop EF301,EF303,EF352 (Shin-Akita Chemical Co., Ltd.), Megafac F171,F173 (Dainippon Ink & Chemicals, Inc.), Florad FC430,FC431 (Sumitomo 3M Co., Limited), and Asahiguard AG710,Surfron S-382,SC101,SC102, SC103,SC104, SC105,SC106 (Asahi Glass Co., Ltd.); and organosiloxane polymer KP341 (Shin-Etsu Chemical Co., Ltd.), acrylic acid or methacrylic acid (co)polymers Polyflow No. 75,No. 95 (Kyoei-Sha Oils and Fats Chemical Industries Co., Ltd.). These surfactants are used in an amount of usually 2 parts by weight or less, preferably 1 part by weight or less, based on 100 parts by weight of the alkali-soluble resin and quinonediazide compound in the resist composition of the present invention.

These surfactants may be used alone or in combination of two or more thereof.

The developing solution for the positive photoresist composition of the present invention may be an aqueous solution of an alkali including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide, tetraethylammonium hydroxide and choline; and cyclic amines such as pyrrole and piperidine. The above alkaline aqueous solution may further contain an appropriate amount of an alcohol such as isopropyl alcohol and a nonionic surfactant.

The positive photoresist composition of the present invention may contain, if desired, a light absorber, a crosslinking agent, or an adhesive aid. A light absorber is added for preventing halation from a substrate or increasing visibility when coated on a transparent substrate, if needed. Specific examples of the light absorber which can be preferably used in the present invention include those commercially available and disclosed in *Kogyo-yo Shikiso No Gijutsu To Shijo* (Technology and Market for Industrial Pigments) (CMC Publishing Co.) and *Senryo Binran* (Dye Handbook) (edited by the Association of Chemistry of Organic Synthesis), for example, C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10 and C.I. Pigment Brown 2. A light absorber is generally used in an amount of 100 parts by weight or less, preferably 50 parts by weight or less, and more preferably 30 parts by weight or less, based on 100 parts by weight of the alkali-soluble resin.

The crosslinking agent is added in the range not affecting positive image formation, for the purpose of adjusting the sensitivity, improving the heat resistance and improving the dry etching resistance.

Examples of the crosslinking agent include compounds obtained by reacting melamine, benzoguanamine, glycoluril or the like with formaldehyde or an alkyl-modified product thereof, epoxy compounds, aldehydes, azide compounds, organic peroxides, and hexamethylenetetramines. The crosslinking agent can be used in an amount of less than 10 parts by weight, preferably less than 5 parts by weight, based on 100 parts by weight of the photosensitive material. If the amount of the crosslinking agent to the photosensitive material exceeds 10 parts by weight, the sensitivity lowers and scum (resist residue) is liable to occur.

The adhesive aid is added primarily for improving adhesion of the substrate and the resist, in particular, for the purpose of preventing the resist film from causing peeling off during the etching process. Specific examples of the adhesive aid include chlorosilane such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole, and mercaptopyrimidine; ureas such as 1,1-dimethylurea and 1,3-dimethylurea; and thiourea compounds.

The adhesive aid is usually used in an amount of less than 10 parts by weight, preferably less than 5 parts by weight, based on 100 parts by weight of the alkali-soluble resin.

The above described positive photoresist composition is coated by an appropriate coating means such as a spinner or a coater on a substrate commonly used in the production of precision integrated circuit elements (e.g., transparent substrate such as silicon/silicon dioxide-coated substrate, glass substrate, ITO substrate), pre-baked, exposed through a desired mask, subjected to PEB (post exposure bake) if necessary, developed, rinsed, and dried. Thus a satisfactory resist can be obtained.

The photoresist composition of the present invention can also be used for a positive PS plate.

The present invention is explained in more detail with reference to the following examples, but the present invention should not be construed as being limited thereto. Unless otherwise indicated, all percents and parts are by weight.

SYNTHESIS EXAMPLE (1) Synthesis of Novolak Resin (a-1):

259.54 g of m-cresol, 9.73 g of p-cresol, 62.31 g of 2,3-xylenol and 218.14 g of a 37.17% aqueous solution of formaldehyde were charged in a three-necked flask of one-liter capacity equipped with a stirrer, a reflux condenser and a thermometer, and 1.13 g of oxalic acid dihydrate was added thereto while stirring the mixture at 90° C. After 30 minutes, the bath temperature was raised to 130° C., and the reaction mixture was further stirred for 3 hours and 30 minutes under reflux. Subsequently, the reflux condenser was replaced with a Liebig condenser, and the bath temperature was raised to 200° C. over about 1 hour, followed by removal of unreacted formalin, water and the like. After distillation was carried out further 1 hour under atmospheric pressure, the pressure was gradually reduced to 1 mm Hg and unreacted monomers and the like were distilled off. The distillation under reduced pressure took 2 hours.

The temperature was lowered to room temperature and the melted alkali-soluble novolak resin was recovered. The weight average molecular weight of the thus-obtained novolak resin was 2,290 (calculated in terms of polystyrene).

100 g of this novolak resin was dissolved in 1,000 g of acetone, and 1,000 g of n-hexane was added thereto while stirring, followed by stirring for additional 30 minutes at room temperature, and allowing to stand for 1 hour. The upper layer was removed by decantation and the solvent was removed from the remaining lower layer using a rotary evaporator to obtain thereby a solid Novolak Resin (a-1). The thus-obtained Novolak Resin (a-1) had a weight average molecular weight of 5,430 (in terms of polystyrene) and a degree of dispersion of 2.4.

(2) Synthesis of Novolak Resins (a-2) to (a-17)

In the same manner as above (1), monomers were charged into a reaction vessel in predetermined mol % (m-cresol/p-cresol/xylenol) as shown in Table 1 below, and condensed with predetermined amount of formaldehyde to obtain thereby Novolak Resins (a-2) to (a-17).

Further, in Table 1 below, method of fractionation A means that fractionation was carried out in the same manner as in (1) above by dissolving 100 g of novolak resin in 1,000 g of acetone, followed by separation using 1,000 g of n-hexane, and fractionation B means that fractionation was carried out by dissolving 100 g of novolak resin in 1,000 g of acetone, followed by separation using 2,000 g of n-hexane.

(3) Synthesis of Novolak Resin (a-18):

227.09 g of m-cresol, 15.14 g of bis-hydroxymethyl-p-cresol, 98.96 g of 2,3-xylenol and 249.64 g of a 37.17% aqueous solution of formaldehyde were charged in a three-necked flask of one-liter capacity equipped with a stirrer, a reflux condenser and a thermometer, and 1.13 g of oxalic acid dihydrate was added thereto with stirring the mixture at 90° C. After 30 minutes, the bath temperature was raised to 130° C., and the reaction mixture was further stirred for 3 hours and 30 minutes under reflux. Subsequently, the reflux condenser was replaced with a Liebig condenser, and the bath temperature was raised to 200° C. over about 1 hour, followed by removal of unreacted formaldehyde, water and the like. After distillation was carried out for additional 1 hour under atmospheric pressure, the pressure was gradually reduced to 1 mm Hg and unreacted monomers and the like were distilled off. The distillation under reduced pressure took 2 hours.

The temperature was lowered to room temperature and the melted alkali-soluble novolak resin was recovered. The weight average molecular weight of the thus-obtained novolak resin was 4,200 (calculated in terms of polystyrene).

100 g of this novolak resin was dissolved in 1,000 g of acetone, and 1,000 g of n-hexane was added thereto while stirring, followed by stirring for further 30 minutes at room temperature, and allowing to stand for 1 hour. The upper layer was removed by decantation and the solvent was removed from the remaining lower layer using a rotary evaporator to obtain thereby a solid Novolak Resin (a-18). The thus-obtained Novolak Resin (a-18) had a weight average molecular weight of 7,760 (in terms of polystyrene) and a degree of dispersion of 2.93.

TABLE 1

| | | | | | | | |
|---|---|---|---|---|---|---|---|
| | | | | (Example) | | | |
| Novolak Resin | Kind of Xylenol | Charging Ratio (mol %) | Molecular Weight | Molecular Weight after Fractionation | Method of Fractionation | Degree of Dispersion | Alkali Dissolution Speed |
| a-1 | 2,3 | 80/3/17 | 2,290 | 5,430 | A | 2.4 | 94 |
| a-2 | 2,3 | 80/3/17 | 4,110 | 8,160 | A | 2.8 | 36 |
| a-3 | 2,3 | 80/3/17 | 4,990 | 9,240 | A | 2.9 | 23 |
| a-4 | 2,3 | 80/3/17 | 5,520 | 10,400 | A | 3.2 | 5.4 |
| a-5 | 2,3 | 70/3/27 | 5,510 | 10,330 | A | 3.1 | 12 |
| a-6 | 2,3 | 60/3/37 | 3,140 | 6,490 | A | 2.8 | 18 |
| a-7 | 2,3 | 60/3/37 | 5,730 | 11,620 | A | 3.3 | 3.8 |
| a-8 | 2,3 | 50/3/47 | 3,740 | 5,470 | B | 2.1 | 48 |

TABLE 1-continued (Example)

| Novolak Resin | Kind of Xylenol | Charging Ratio (mol %) | Molecular Weight | Molecular Weight after Fractionation | Method of Fractionation | Degree of Dispersion | Alkali Dissolution Speed |
|---|---|---|---|---|---|---|---|
| a-9 | 2,3 | 50/3/47 | 5,070 | 7,140 | B | 2.2 | 25 |
| a-10 | 3,4 | 80/3/17 | 2,970 | 6,310 | A | 2.7 | 11 |
| a-11 | 3,4 | 70/3/27 | 2,410 | 5,220 | A | 2.5 | 8.3 |
| a-12 | 3,5 | 80/3/17 | 2,500 | 5,920 | A | 2.5 | 26 |
| a-13 | 3,5 | 80/3/17 | 5,400 | 11,030 | A | 3.3 | 9.1 |
| a-14 | 3,5 | 70/3/27 | 3,520 | 5,200 | B | 2.6 | 26 |
| a-15 | 3,5 | 70/3/27 | 4,780 | 7,130 | B | 3.1 | 10 |
| a-16 | 3,5 | 60/3/37 | 2,620 | 4,230 | B | 2.2 | 8 |
| a-17 | 3,5 | 50/3/47 | 2,330 | 3,620 | B | 2.2 | 19 |
| a-18 | 2,3 | 70/3/27 | 4,200 | 7,760 | A | 2.9 | 20 |

(4) Synthesis of Novolak Resins (b-1) to (b 13):

In the same manner as above (3), monomers were charged into a reaction vessel in predetermined mol % (m-cresol/p-cresol/xylenol) as shown in Table 2 below, and condensed with predetermined amount of formaldehyde to obtain obtain thereby Novolak Resins (b-1) to (b-13).

Further, in Table 2, method of fractionation A means that fractionation was carried out in the same manner as in (1) above by dissolving 100 g of novolak resin in 1,000 g of acetone, followed by separation using 1,000 g of n-hexane, and fractionation B means that fractionation was carried out by dissolving 100 g of novolak resin in 1,000 g of acetone, followed by separation using 2,000 g of n-hexane.

(6) Synthesis of Photosensitive Material (S-2):

53.7 g of Compound (2) shown in Table 3 below, 53.7 g of 1,2-naphthoquinonediazido-5-sulfonyl chloride and 800 ml of acetone were charged into a three-necked flask and dissolved uniformly.

Then, 21.2 g of triethylamine was added dropwise thereto gradually and the reaction system was allowed to react for 3 hours at 25° C.

The reaction mixture was poured into 3 liters of a 1% aqueous solution of hydrochloric acid, and the precipitates generated were filtrated, washed and dried to obtain thereby 90.2 g of Photosensitive Material (S-2).

TABLE 2

(Comparative Example)

| Novolak Resin | Kind of Xylenol | Charging Ratio (mol %) | Molecular Weight | Molecular Weight after Fractionation | Method of Fractionation | Degree of Dispersion | Alkali Dissolution Speed |
|---|---|---|---|---|---|---|---|
| b-1 | 2,5 | 80/3/17 | 4,340 | 9,070 | A | 2.8 | 20 |
| b-2 | 2,5 | 70/3/27 | 5,120 | 11,080 | A | 3.2 | 9.1 |
| b-3 | 2,5 | 60/3/37 | 3,350 | 7,120 | A | 3 | 15 |
| b-4 | 2,5 | 50/3/47 | 5,010 | 6,990 | B | 2.1 | 25 |
| b-5 | 2,3 | 70/0/30 | 5,440 | 10,530 | A | 3.1 | 13 |
| b-6 | 2,3 | 60/0/40 | 5,610 | 10,730 | A | 3.2 | 4.3 |
| b-7 | 2,3 | 70/5/25 | 5,120 | 9,880 | A | 3.1 | 6.3 |
| b-8 | 2,3 | 70/20/10 | 4,670 | 8,740 | A | 2.8 | 13 |
| b-9 | 2,3 | 70/3/27 | 6,860 | 13,910 | B | 4.4 | 3.8 |
| b-10 | 2,3 | 70/3/27 | 6,620 | 14,030 | A | 3.8 | 2.8 |
| b-11 | 2,3 | 70/3/27 | 2,950 | 4,590 | B | 2.7 | 125 |
| b-12 | 2,3 | 80/3/17 | 7,120 | 21,200 | A | 3.8 | 4.2 |
| b-13 | 2,3 | 80/3/17 | 2,290 | 2,810 | B | 2.7 | 95 |

(5) Synthesis of Photosensitive Material (S-1):

38.9 g of Compound (1) shown in Table 3 below, 53.7 g of 1,2-naphthoquinonediazido-5-sulfonyl chloride and 800 ml acetone were charged into a three-necked flask and dissolved uniformly.

Then, 20.8 g of N-methylpiperidine was added dropwise thereto gradually and the reaction system was allowed to react for 3 hours at 25° C.

The reaction mixture was poured into 3 liters of a 1% aqueous solution of hydrochloric acid, and the precipitates generated were filtrated, washed and dried to obtain thereby 76.6 g of Photosensitive Material (S-1).

(7) Synthesis of Photosensitive Material (S-3):

35.3 g of Compound (3) shown in Table 3 below, 53.7 g of 1,2-naphthoquinonediazido-5-sulfonyl chloride and 800 ml of acetone were charged into a three-necked flask and dissolved uniformly.

Then, 21.2 g of triethylamine was added dropwise thereto gradually and the reaction system was allowed to react for 3 hours at 25° C.

The reaction mixture was poured into 3 liters of a 1% aqueous solution of hydrochloric acid, and the precipitates generated were flitrated, washed and dried to obtain thereby 75.0 g of Photosensitive Material (S-3).

(8) Synthesis of Photosensitive Material (S-4):

60.5 g of Compound (4) shown in Table 3 below, 53.7 g of 1,2-naphthoquinonediazido-5-sulfonyl chloride and 800 ml of acetone were charged into a three-necked flask and dissolved uniformly.

Then, 21.2 g of triethylamine was added dropwise thereto gradually and the reaction system was allowed to react for 3 hours at 25° C.

The reaction mixture was poured into 3 liters of a 1% aqueous solution of hydrochloric acid, and the precipitates generated were filtrated, washed and dried to obtain thereby 101.8 g of Photosensitive Material (S-4).

TABLE 3

Mother Nucleus Compound of Photosensitive Material

Compound

[1] (structure)

[2] (structure)

[3] (structure)

[4] (structure)

(9) Preparation and Evaluation of Positive Photoresist Composition

Novolak Resins (a-1) to (a-18) and (b-1) to (b-13) obtained in the (1) to (4) above, Photosensitive Materials (S-1) to (S-4) obtained in (5) to (8) above, Solvents (Y-1) to (Y-4), and Polyhydroxy Compounds (P-1) to (P-3) shown in Table 4 below were mixed in proportions shown in Table 5 below to make uniform solutions, and then they were filtrated through a 0.10-μm microfilter to prepare photoresist compositions. The thus prepared photoresist compositions were coated onto a silicon wafer using a spinner and dried on a vacuum contact type hot plate at 90° C. for 60 seconds to obtain resist films having a thickness of 0.97 μm.

TABLE 4

Polyhydroxy Compound

Compound

P-1 (structure)

P-2 (structure)

P-3 (structure)

TABLE 5

| Example No. | Novolak Resin | | Photosensive Material | | Polyhydroxy Compound | | Solvent | |
|---|---|---|---|---|---|---|---|---|
| | Kind | Addition Amount | Kind | Addition Amount | Kind | Addition Amount | Kind | Addition Amount |
| 1 | a-1 | 100 | S-4 | 60 | P-2 | 20 | Y-1 | 570 |
| 2 | a-2 | 100 | S-2 | 75 | P-1 | 40 | Y-2/Y-4 | 545/135 |
| 3 | a-3 | 100 | S-3 | 75 | P-1 | 40 | Y-2/Y-4 | 545/135 |
| 4 | a-4 | 100 | S-1 | 70 | P-1 | 50 | Y-2/Y-4 | 560/140 |
| 5 | a-5 | 100 | S-2 | 70 | P-1 | 45 | Y-3 | 680 |
| 6 | a-6 | 100 | S-4 | 65 | P-1 | 40 | Y-1 | 650 |
| 7 | a-7 | 100 | S-1 | 50 | P-3 | 50 | Y-2/Y-4 | 510/120 |
| 8 | a-8 | 100 | S-3 | 75 | P-1 | 35 | Y-3 | 665 |
| 9 | a-9 | 100 | S-2 | 70 | P-2 | 40 | Y-2/Y-4 | 530/135 |
| 10 | a-10 | 100 | S-2 | 75 | P-1 | 45 | Y-1 | 700 |

TABLE 5-continued

| | | | | | | | | |
|---|---|---|---|---|---|---|---|---|
| 11 | a-11 | 100 | S-4 | 70 | P-1 | 45 | Y-2/Y-4 | 545/135 |
| 12 | a-12 | 100 | S-3 | 75 | P-2 | 40 | Y-3 | 680 |
| 13 | a-13 | 100 | S-4 | 75 | P-1 | 50 | Y-2/Y-4 | 570/140 |
| 14 | a-14 | 100 | S-1 | 80 | P-1 | 30 | Y-1 | 665 |
| 15 | a-15 | 100 | S-3 | 60 | P-1 | 50 | Y-2/Y-4 | 530/135 |
| 16 | a-16 | 100 | S-2 | 65 | P-3 | 50 | Y-3 | 680 |
| 17 | a-17 | 100 | S-1 | 70 | P-1 | 45 | Y-2/Y-4 | 545/135 |
| 18 | a-18 | 100 | S-2 | 75 | P-1 | 40 | Y-2/Y-4 | 545/135 |
| 19 | a-2 | 100 | S-1/S-4 | 35/35 | P-1 | 40 | Y-2/Y-4 | 530/135 |

| Comparative Example No. | Novolak Resin | | Photosensitive Material | | Polyhydroxy Compound | | Solvent | |
|---|---|---|---|---|---|---|---|---|
| | Kind | Addition Amount | Kind | Addition Amount | Kind | Addition Amount | Kind | Addition Amount |
| 1 | b-1 | 100 | S-3 | 75 | P-1 | 40 | Y-2/Y-4 | 545/135 |
| 2 | b-2 | 100 | S-2 | 70 | P-1 | 45 | Y-3 | 680 |
| 3 | b-3 | 100 | S-4 | 65 | P-1 | 40 | Y-1 | 650 |
| 4 | b-4 | 100 | S-2 | 70 | P-1 | 45 | Y-3 | 680 |
| 5 | b-5 | 100 | S-2 | 70 | P-1 | 45 | Y-3 | 680 |
| 6 | b-6 | 100 | S-4 | 65 | P-1 | 40 | Y-1 | 650 |
| 7 | b-7 | 100 | S-2 | 70 | P-1 | 45 | Y-3 | 680 |
| 8 | b-8 | 100 | S-2 | 70 | P-1 | 45 | Y-3 | 680 |
| 9 | b-9 | 100 | S-2 | 70 | P-1 | 45 | Y-3 | 680 |
| 10 | b-10 | 100 | S-2 | 70 | P-1 | 45 | Y-3 | 680 |
| 11 | b-11 | 100 | S-2 | 70 | P-1 | 45 | Y-3 | 680 |
| 12 | b-12 | 100 | S-1 | 70 | P-1 | 50 | Y-2/Y-4 | 560/140 |
| 13 | b-13 | 100 | S-4 | 60 | P-2 | 20 | Y-1 | 570 |
| 14 | a-2 | 100 | S-2 | 110 | P-1 | 40 | Y-2/Y-4 | 660/160 |
| 15 | a-2 | 100 | S-2 | 30 | P-1 | 40 | Y-2/Y-4 | 430/110 |
| 16 | a-2 | 100 | S-2 | 75 | P-1 | 65 | Y-2/Y-4 | 610/150 |
| 17 | a-2 | 100 | S-2 | 75 | P-1 | 5 | Y-2/Y-4 | 280/70 |

Y-1: Ethyl cellosolve acetate
Y-2: Ethyl 2-hydroxypropionate
Y-3: Methyl 3-methoxypropionate
Y-4: Ethyl 3-ethoxypropionate The films were exposed using a reduction projection exposure device (reduction projection exposure device NSR-2005i9C, manufactured by Nikon Co.), and then PEB was conducted at 110° C. for 60 seconds, developed with a 2.38% aqueous solution of tetramethylammonium hydroxide for 1 minute, washed with water for 30 seconds and dried.

The thus obtained resist pattern of the silicon wafer was observed with a scanning electron microscope to evaluate the resist. The results obtained are shown in Table 6 below.

The sensitivity was defined as the reciprocal of the exposure amount to reproduce a mask pattern of 0.40 μm, and expressed as a relative value to the sensitivity of the resist of Comparative Example 1.

The resolving power is the critical resolving power in the exposure amount to reproduce a mask pattern of 0.40 μm.

The defocus latitude was evaluated by observing the cross section of a resist pattern with a scanning electron microscope for the range of the focus at which a resist pattern of 0.40 μm isolates without decreasing film thickness in effective sensitivity.

The alkali solubility of the novolak resin was measured by immersing the novolak resin film coated on a silicon wafer in a 2.38% aqueous solution of tetramethyl-ammonium hydroxide at 23° C. using DRM of Perkin Elmer Co.

TABLE 6

| Example No. | Relative Sensitivity | Resolving Power (μm) | Defocus (μm) |
|---|---|---|---|
| Example 1 | 1.3 | 0.31 | 1.5 |
| Example 2 | 1.2 | 0.29 | 1.6 |
| Example 3 | 1.1 | 0.30 | 1.5 |
| Example 4 | 1.0 | 0.29 | 1.6 |
| Example 5 | 1.2 | 0.30 | 1.6 |
| Example 6 | 1.1 | 0.30 | 1.5 |
| Example 7 | 1.0 | 0.30 | 1.5 |
| Example 8 | 1.1 | 0.29 | 1.6 |
| Example 9 | 1.1 | 0.29 | 1.5 |
| Example 10 | 1.2 | 0.31 | 1.5 |
| Example 11 | 1.1 | 0.30 | 1.5 |
| Example 12 | 1.3 | 0.29 | 1.6 |
| Example 13 | 1.1 | 0.30 | 1.5 |
| Example 14 | 1.2 | 0.31 | 1.6 |
| Example 15 | 1.0 | 0.30 | 1.5 |
| Example 16 | 1.0 | 0.31 | 1.5 |
| Example 17 | 1.1 | 0.29 | 1.6 |
| Comparative Example 1 | 1.0 | 0.33 | 1.2 |
| Comparative Example 2 | 0.9 | 0.32 | 1.3 |
| Comparative Example 3 | 0.8 | 0.31 | 1.3 |
| Comparative Example 4 | 0.9 | 0.32 | 1.3 |
| Comparative Example 5 | 1.1 | 0.31 | 1.3 |
| Comparative Example 6 | 1.1 | 0.31 | 1.3 |
| Comparative Example 7 | 0.9 | 0.33 | 1.2 |
| Comparative | 0.8 | 0.34 | 1.0 |

TABLE 6-continued

| Example No. | Relative Sensitivity | Resolving Power (μm) | Defocus (μm) |
|---|---|---|---|
| Example 8 Comparative Example 9 | 1.1 | 0.35 | 0.8 |
| Comparative Example 10 | 0.7 | 0.34 | 0.8 |
| Comparative Example 11 | 1.3 | 0.33 | 1.3 |
| Comparative Example 12 | 0.7 | 0.35 | 0.8 |
| Comparative Example 13 | 1.3 | 0.36 | 1.0 |
| Comparative Example 14 | 0.8 | 0.33 | 1.3 |
| Comparative Example 15 | 1.3 | 0.36 | 1.0 |
| Comparative Example 16 | 1.2 | 0.36 | 1.0 |
| Comparative Example 17 | 0.8 | 0.36 | 1.0 |

In Table 6 above, each evaluation means as follows.

With respect to relative sensitivity, the larger the numeral, the higher is the sensitivity.

With respect to resolving power, the smaller the numeral, the finer is the line resolved.

With respect to the defocus, a larger numeral means a larger degree of defocusing that still enables to form an image. The numerals shown in the column of the defocus indicate how mach the focal plane is shifted from the resist.

It can be seen from Table 6 that excellent results can be obtained by satisfying the all constitutional requisites of the present invention.

A positive photoresist using the alkali-soluble novolak resin according to the present invention is excellent in resist performances such as the sensitivity, resolving power and defocus latitude.

While the invention has been described in detail and with reference to specific examples thereof, it will be apparent to one skilled in the art that various changes and modifications can be made therein without departing from the spirit and scope thereof.

What is claimed is:

1. A positive photoresist composition comprising an alkali-soluble novolak resin (A), a 1,2-quinonediazide compound (B), and an alkali dissolution accelerator (C), wherein said alkali-soluble novolak resin (A) is a novolak resin which is obtained by condensing the following monomers (1) to (3):
(1) from 40 to 90 mol % of m-cresol,
(2) from 2 to 4 mol % of p-cresol, and
(3) from 10 to 60 mol % of at least one xylenol selected from 2,3-xylenol, 3,4-xylenol and 3,5-xylenol with an aldehyde, and which has a weight average molecular weight of from 3,000 to 20,000, a degree of dispersion (Mw/Mn) of from 1.5 to 4.0, and an alkali dissolution speed in a 2.38% aqueous solution of tetramethylammonium hydroxide at 23° C. of from 3 to 100 Å/sec, the 1,2-quinonediazide compound (B) is an esterified product of a polyhydroxy compound having from 3 to 7 phenolic hydroxyl groups in the molecule and 1,2-naphthoquinonediazido-5-sulfonyl chloride and/or 1,2-naphthoquinonediazido-4-sulfonyl chloride, the alkali dissolution accelerator (C) is a polyhydroxy compound having a molecular weight of 1,000 or less and having from 2 to 7 phenolic hydroxyl groups in the molecule, and the 1,2-quinonediazide compound (B) is present in an amount of from 35 to 100 parts by weight, and the alkali dissolution accelerator (C) is present in an amount of from 10 to 60 parts by weight, respectively, per 100 parts by weight of said alkali-soluble novolak resin (A).

2. The positive photoresist composition of claim 1, wherein said aldehyde is at least one compound selected from formaldehyde, paraformaldehyde, trioxane, acetaldehyde, furfural, benzaldehyde, hydroxybenzaldehydes, crotonaldehyde, and chloroacetaldehyde.

3. The positive photoresist composition of claim 1, wherein said aldehyde is used in an amount of 0.4 to 2.0 mol % based on the total moles of said monomer (1) to (3).

* * * * *